(12) United States Patent
Jemison et al.

(10) Patent No.: US 11,698,415 B1
(45) Date of Patent: Jul. 11, 2023

(54) BATTERY MANAGEMENT SYSTEM WITH OPERATIONAL STATES

(71) Applicant: BETA AIR, LLC, South Burlington, VT (US)

(72) Inventors: Cullen Jemison, Winooski, VT (US); Braedon Lohe, Essex Junction, VT (US); Nathan William Joseph Wiegman, Williston, VT (US)

(73) Assignee: BETA AIR, LLC, South Burlington, VT (US)

( * ) Notice: Subject to any disclaimer, the term of this patent is extended or adjusted under 35 U.S.C. 154(b) by 0 days.

(21) Appl. No.: 17/890,561

(22) Filed: Aug. 18, 2022

(51) Int. Cl.
| | | |
|---|---|---|
| *G08B 21/00* | (2006.01) | |
| *G01R 31/385* | (2019.01) | |
| *H01M 10/42* | (2006.01) | |
| *H02J 7/00* | (2006.01) | |
| *G01R 31/382* | (2019.01) | |

(52) U.S. Cl.
CPC ......... *G01R 31/385* (2019.01); *G01R 31/382* (2019.01); *H01M 10/425* (2013.01); *H02J 7/0063* (2013.01); *H01M 2010/4271* (2013.01); *H01M 2010/4278* (2013.01)

(58) Field of Classification Search
CPC . G01R 31/385; G01R 31/382; H01M 10/425; H01M 2010/4271; H01M 2010/4278; H02J 7/0063
USPC ....................................................... 340/636.1
See application file for complete search history.

(56) References Cited

U.S. PATENT DOCUMENTS

| | | | |
|---|---|---|---|
| 5,635,816 A * | 6/1997 | Welsh ................ | H02J 7/35 320/145 |
| 11,309,596 B1 * | 4/2022 | Mische .............. | B60L 58/25 |
| 2011/0089953 A1 * | 4/2011 | Chandler ........... | G01R 31/396 324/427 |
| 2015/0084554 A1 * | 3/2015 | Tsuruta ............. | B25F 5/00 318/139 |
| 2017/0331323 A1 * | 11/2017 | Ehrmantraut ...... | H02J 7/35 |
| 2019/0089020 A1 * | 3/2019 | Ikeno ................ | H01M 10/441 |
| 2021/0152003 A1 * | 5/2021 | Kondo .............. | H02J 7/00712 |

* cited by examiner

*Primary Examiner* — Mark S Rushing
(74) *Attorney, Agent, or Firm* — Caldwell Intellectual Property Law

(57) ABSTRACT

A battery management system includes a low-power chip that allows battery management system, or components thereof, to alternate between operational states. Operational states may include a first state, a second state, a third state, and the like. A method of operation by a battery management system for an electric aircraft is also provided.

20 Claims, 9 Drawing Sheets

BATTERY MANAGEMENT SYSTEM WITH OPERATIONAL STATES

FIELD OF THE INVENTION

The present invention generally relates to the field of electric aircraft. In particular, the present invention is directed to a battery management system, for an energy source of an electric aircraft, that operates at various states.

BACKGROUND

The burgeoning of electric vertical take-off and landing (eVTOL) aircraft technologies promises an unprecedented forward leap in energy efficiency, cost savings, and the potential of future autonomous and unmanned aircraft. However, the technology of eVTOL aircraft is still lacking in crucial areas of energy source solutions.

SUMMARY OF THE DISCLOSURE

In an aspect, a battery management system for an electric aircraft is provided. The system includes a plurality of sensors configured to detect a plurality of measurement data corresponding to at least an operating condition of a battery module; and a control circuit communicatively connected to the plurality of sensors and configured to monitor the operating condition of the battery module as a function of the plurality of measurement data, wherein: the control circuit is configured to transition from a first state and a second state upon identifying a state transition criterion as a function of the measurement data; the control circuit, when in the first state, operates at a first duty cycle and communicates with a first subset of the plurality of sensors; and the control circuit, when in the second state, operates at a second duty cycle and communicates with a second subset of the plurality of sensors, wherein: the second duty cycle is distinct from the first duty cycle; and the second subset is distinct from the first subset.

In another aspect, a method of operation by a battery management system for an electric aircraft. The method including: receiving, by a plurality of sensors, measurement data corresponding to at least an operating condition of a battery module; identifying, by a control circuit communicatively connected to the plurality of sensors, a state transition criterion as a function of the measurement data; and transitioning, by the control circuit, from a first state and a second state; wherein the control circuit, when in the first state, operates at a first duty cycle and communicates with a first subset of the plurality of sensors; and wherein the control circuit, when in the second state, operates at a second duty cycle and communicates with a second subset of the plurality of sensors, wherein: the second duty cycle is distinct from the first duty cycle; and the second subset is distinct from the first subset.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

Figure 1:
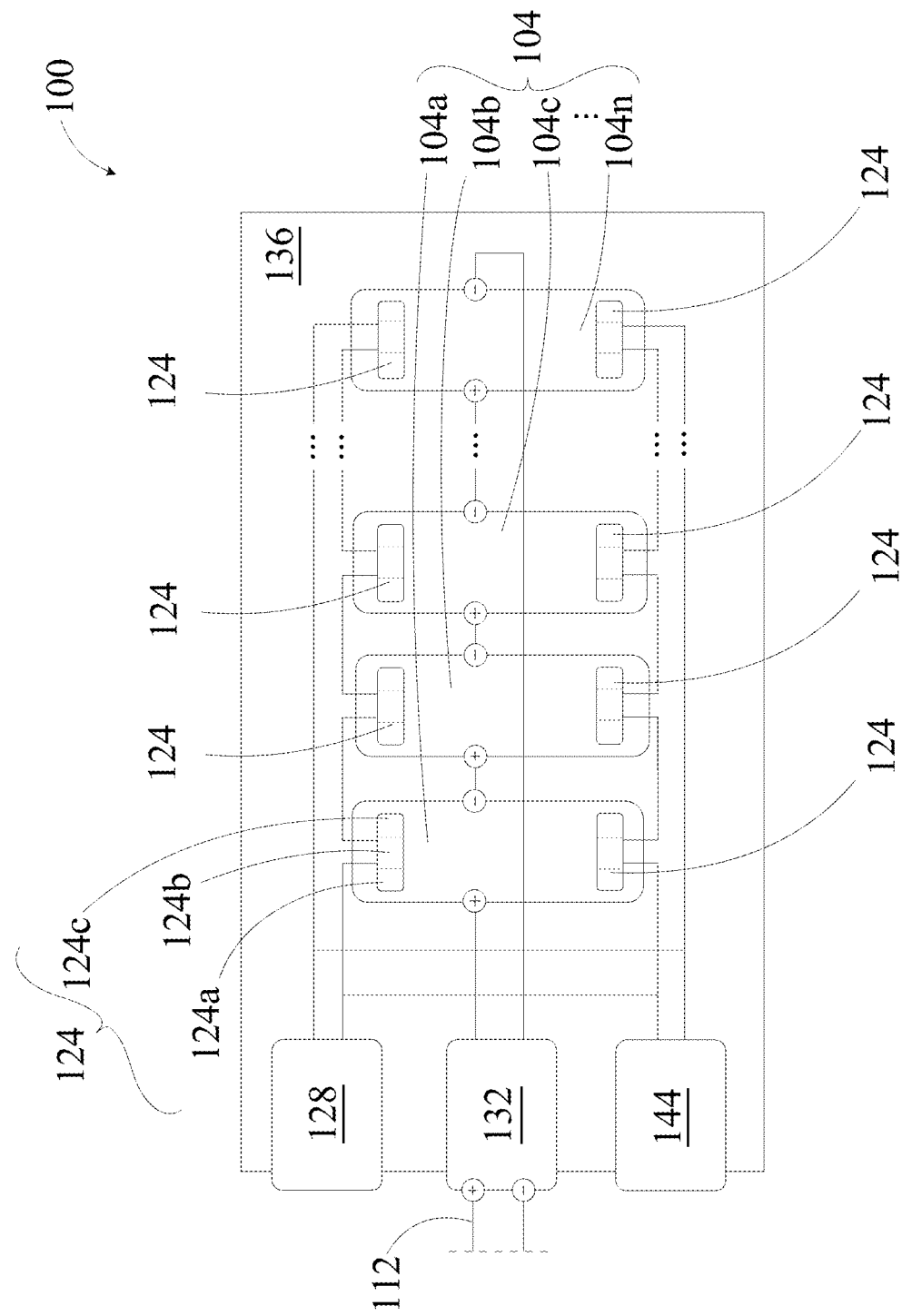
FIG. 1 is a block diagram of an exemplary embodiment of a battery management system in one or more aspects of the present disclosure.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

That present disclosure includes battery management systems and related techniques that are provided to improve the monitoring and controlling of an electric aircraft energy source, such as a battery pack. More specifically, a battery pack with a battery management system (BMS) is provide, where the battery management is configured to measure and monitor one or more operating conditions of one or more components of the battery pack to ensure the battery pack is operating properly and to prevent and/or reduce damage to the electric aircraft if the battery pack experiences a malfunction or catastrophic failure. BMS may include a control circuit that is configured to monitor one or more battery modules of the battery pack, where the control circuit monitors the battery modules a various duty cycles depending on an operational state of the control circuit.

In some aspects, BMS may include one or more low power chips that may switch control circuit between different operational states, depending on a condition of the battery and/or surrounding environment. For example, control circuit may enter a first state when a battery module of battery pack is being used in flight. In this first state, control circuit may operate at a first duty cycle and monitor a wide variety of conditions and/or characteristics using, for example, a first subset of sensors. For example, and without limitation, control circuit may continuously monitor the state of charge, voltage, temperature, and the like, of battery pack and/or components thereof, when operating at a first duty cycle.

In other aspects, control circuit may also include a second state of operation. Control circuit may operate at a second duty cycle when in the second state. Control circuit may operate in second state when, for example, battery pack and/or components thereof are being recharged. In the second state, BMS may monitor fewer conditions and/or characteristics of battery pack and/or components thereof using, for example, a second subset of sensors.

In other aspects, control circuit may also include a third state of operation, which control circuit switches to when dormant. For example, control circuit may become dormant when battery pack and/or components thereof are not installed on aircraft. In this mode, control circuit may operate at a third duty cycle and, for example, be woken by low power chips at an infrequent, regular interval. For example, and without limitation, the regular interval may be once every hour or once every day. When control circuit is woken, battery management system may perform, for example and without limitation, a health check using a third subset of sensors. The health check may include taking various measurements of battery module to detect various characteristics and/or conditions of battery pack and/or components thereof. In some nonlimiting embodiments, battery management system may log and/or store any measured or determined data locally. In other nonlimiting embodiments, battery management system may record such data in a memory component of BMS or in a remote database using a network.

In the following description, for the purposes of explanation, numerous specific details are set forth in order to provide a thorough understanding of the present invention. It will be apparent, however, that the present invention may be practiced without these specific details. As used herein, the word "exemplary" or "illustrative" means "serving as an example, instance, or illustration." Any implementation described herein as "exemplary" or "illustrative" is not necessarily to be construed as preferred or advantageous over other implementations. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply embodiments of the inventive concepts defined in the appended claims. Hence, specific dimensions and other physical characteristics relating to the embodiments disclosed herein are not to be considered as limiting, unless the claims expressly state otherwise.

Referring now to FIG. 1, an embodiment of a battery management system 100 (also referred to as a "BMS" in this disclosure) of an energy source, such as a battery pack 136, is presented in accordance with one or more embodiments of the present disclosure. In one or more embodiments, battery pack 136 includes a battery module 104, which is configured to provide energy to an electric aircraft, such as electric aircraft 700 of FIG. 9, via a power supply connection 112. For the purposes of this disclosure, a "power supply connection" is an electrical and/or physical communication between a battery module 104 and electric aircraft that powers electric aircraft and/or electric aircraft subsystems for operation of electric aircraft. In one or more embodiments, battery pack 136 may include a plurality of battery modules, such as modules 104a-n. For example, and without limitation, battery pack 136 may include fourteen battery modules. In one or more embodiments, each battery module 104a-n may include a battery cell, such as battery cells 504 shown in FIG. 5B. For example, and without limitation, battery module 104 may include a plurality of battery cells. In various embodiments, battery management system 100 may be integrated into battery pack 136, such as in a portion of battery pack 136 or a subassembly thereof. In other various embodiments, BMS 100 may be a separate component that may be installed into or near battery pack 136. One of ordinary skill in the art will appreciate that there are various areas in and on a battery pack and/or subassemblies thereof that may include battery management system 100. In one or more embodiments, BMS 100 may be disposed directly over, adjacent to, facing, within, and/or near a battery module.

Still referring to FIG. 1, BMS 100 may include a plurality of sensors 124 and a control circuit 128. In one or more embodiments, BMS 100 may include one or more sensors, such as plurality of sensors 124, as discussed further in this disclosure. For example, and without limitation, BMS 100 may include a sensor suite 500 (shown in FIG. 5) having a plurality of sensors. In one or more embodiments, plurality of sensors 124 may include one or more module monitor units (MMUs) that may be mechanically connected and communicatively connected to battery module 104, which is discussed further in this disclosure. Plurality of sensors 124 may be communicatively connected to battery modules 104 and control circuit 128. As used herein, "communicatively connected" is a process whereby one device, component, or circuit is able to receive data from and/or transmit data to another device, component, or circuit. In an embodiment, communicative connecting includes electrically connecting at least an output of one device, component, or circuit to at least an input of another device, component, or circuit. Plurality of sensor may include a sensor suite, as discussed further in this disclosure, or one or more individual sensors, which may include, but are not limited to, one or more temperature sensors, voltmeters, current sensors, hydrometers, infrared sensors, photoelectric sensors, ionization smoke sensors, motion sensors, pressure sensors, radiation sensors, level sensors, imaging devices, moisture sensors, gas and chemical sensors, flame sensors, electrical sensors, pressure senor, imaging sensors, force sensors, IMU sensor, Hall sensors, bolometers, and combination thereof, or the like. A sensor may be a contact or a non-contact sensor. For example, and without limitation, sensor may be connected to battery module and/or battery cell of battery pack. In other embodiments, sensor may be remote to battery module and/or battery cell.

Still referring to FIG. 1, plurality of sensors 124 includes subsets of plurality of sensors 124 that are each in communication with control circuit 128. For instance, and without limitation, plurality of sensors 124 may include a first subset 124a of plurality of sensors 124, a second subset 124b of plurality of sensors 124, a third subset 124c of plurality of sensors 124, and any additional numbers of subsets of sensors for monitoring conditions of battery modules 104a-n. In one or more nonlimiting embodiments, each battery module 104a-n may include one or more subsets of plurality of sensors 124. For example, and without limitation, each battery module 104a-n may include a first subset 124a, a second subset 124b, and a third subset 124c.

In some embodiments, battery module 104 may include a plurality of MMUs to create redundancy so that, if one MMU fails or malfunctions, another MMU may still operate properly and continue to monitor corresponding battery module 104. In one or more non-limiting exemplary embodiments, MMU may include mature technology so that there is a low risk. Furthermore, MMU may not include software to, for example, increase reliability and durability of MMU and thus, avoid complications often inherent with using software applications. MMU may be configured to monitor and balance all battery cell groups of battery pack 136 during charging of battery pack 136. For instance, and without limitation, MMU may monitor a temperature of battery module 104 and/or a battery cell of battery module 104. For example, and without limitation, MMU may monitor a battery cell group temperature. In another example, and without limitation, MMU may monitor a terminal temperature of battery module 104 to, for example, detect a poor high voltage (HV) electrical connection. In one or more embodiments, an MMU may be indirectly connected to PMU. In other embodiments, MMU may be directly connected to PMU. In one or more embodiments, MMU may be communicatively connected to an adjacent MMU.

Still referring to FIG. 1, in one or more embodiments, plurality of sensors 124 are configured to detect measurement data corresponding to at least an operating condition of a battery module 104 of battery pack 136. For the purposes of this disclosure, an "operating condition" is detected electrical or physical input and/or phenomenon related to a state of a battery pack and/or any components thereof. A state of a battery pack may include detectable information related to, for example, a temperature, a moisture level, a humidity, a voltage, a current, vent gas, vibrations, chemical content, or other measurable characteristics of battery pack 136 or components thereof, such as battery module 104 and/or battery cell 304. For example, and without limitation, plurality of sensors 124 may detect and/or measure one or more operating conditions, such as a temperature, of battery module 104. In one or more embodiments, an operating condition of battery pack 136 may include an operating condition of a battery module 104 and/or battery cell 304. In one or more embodiments, operating condition may include charging of battery pack 136, use of battery pack 136 during flight, dormancy of battery pack 136, and the like. In one or more embodiments, charging of battery pack may include detection of a flow of electrical power between battery pack of electric aircraft and another energy source, such as an energy source of a charging station. In one or more embodiments, use of battery pack during flight may include a transfer of electrical power between battery pack and one or more components of electric aircraft during operation of electric aircraft. In one or more embodiments, dormancy of battery pack may include a termination or lack of transfer of electrical power between battery pack and one or more components of electric aircraft. For example, and without limitation, a battery pack maybe considered dormant if a physical disconnection of wires that provide a communicative connection between battery pack and one or more components of electric aircraft. In another example, and without limitation, battery pack may be considered dormant if a disconnection of battery pack using a high voltage disconnect. In another example, and without limitation, battery pack may be considered dormant if no power is being transferred between battery pack and electric aircraft and/or components thereof.

In one or more embodiments, each sensor of plurality of sensors 124 are configured to detect measurement data corresponding to one or more operating conditions of battery pack and/or components thereof, such as battery module 104. As used in this disclosure, a "sensor" is a device that is configured to detect an input and/or a phenomenon and transmit information and/or datum related to the detection. A sensor may generate a sensor output signal, which transmits information and/or data related to a sensor detection. For example, and without limitation, each sensor of plurality of sensors 124 may generate an output signal to control circuit 128. Sensor output signal may include any signal form described in this disclosure, for example digital, analog, optical, electrical, fluidic, and the like. In some cases, a sensor, a circuit, and/or a controller may perform one or more signal processing steps on a signal. For instance, a sensor, circuit, and/or controller may analyze, modify, and/or synthesize a signal in order to improve the signal, for instance by improving transmission, storage efficiency, or signal to noise ratio. Additional disclosure related to a pack monitoring system can be found in U.S. patent application Ser. No. 17/529,447, entitled "A MODULE MONITOR UNIT FOR AN ELECTRIC AIRCRAFT BATTERY PACK AND METHODS OF USE", the entirety of which in incorporated herein by reference.

In one or more embodiments, plurality of sensors 124 is configured to transmit measurement data related to operating condition of battery module 104. Plurality of sensor 124 may generate an output signal that includes information corresponding to detected operating condition, such as measurement data. For the purposes of this disclosure, "measurement data" is information and/or data related to a detected electrical or physical characteristic and/or phenomenon correlated with an operating condition of a battery pack and/or components thereof. For example, and without limitation, measurement datum may include data of an operating condition regarding a detected temperature of battery module 104. In one or more embodiments, measurement data may be transmitted by each sensor of plurality of sensors 124 to control circuit 128 so that control circuit 128 may receive measurement data, as discussed further in this disclosure.

Still referring to FIG. 1, battery management system 100 includes control circuit 128, which may be communicatively connected to plurality of sensors 124. In one or more embodiments, control circuit 128 is configured to receive measurement data from one or more sensors of the plurality of sensors 124. For example, and without limitation, control circuit 128 may receive a plurality of measurement data associated with one or more operating conditions of a battery module 104 from plurality of sensors 124. In one or more embodiments, control circuit 128 may receive measurement data from plurality of sensors 124 via communication component, such as via communicative connections. For instance, and without limitation, control circuit 128 may receive measurement data from plurality of sensors 124 via a wireless or wired, For example, and without limitation, control circuit 128 may receive measurement data from plurality of sensors 124 via an isoSPI transceiver. connection.

Still referring to FIG. 1, control circuit 128 is configured to identify a state transition criterion as a function of received measurement data. For the purposes of this disclosure, an "operating condition" is a state and/or working order of battery pack 136 and/or any components thereof. Nonlimiting examples of an operating condition may include a state of charge (SOC) of a battery module, a depth of discharge (DOD) or health of battery module, a temperature of battery module, a moisture/humidity level of battery module, a gas level of battery module, a chemical level of battery module. In some embodiments, state transition criterion may be detected by sensors 124 and then transmitted to control circuit 128. In other embodiments, state transition criterion may be identified by control circuit 128 as a function of measurement data of battery module 104. In other embodiments, state transition criterion may be identified from a signal generated by a remote device, as described below in this disclosure. For the purposes of this disclosure, a "state transition criterion" is information and/or data that indicates an operation or usage of battery pack and/or components thereof and thus allows control circuit to determine when to transition between operation states based on the usage of battery module. For example, and without limitation, if state transition criterion indicates that battery module 104 is being charged, then control circuit 128 may be configured to transition from a current state, such as a first state or a third state, to a second state. Control circuit 128 may identify state transition criterion corresponding to charging of battery module based on an operating condition, such as, for example, a specific amount of inputted voltage and/or current being received by battery module 104. In another example, and without limitation, if state transition criterion indicates that battery module 104 is being active and/or used during operation of electric aircraft, then control circuit 128 may be configured to transition from a current state, such as a second state or a third state, to the first state. Control circuit 128 may identify state transition criterion corresponding to active usage of battery module 104 based on an operating condition, such as, for example, a specific amount of voltage and/or current being transfer from battery module 104. In another example, and without limitation, if state transition if state transition criterion indicates that battery module 104 is dormant and/or disconnected during from electric aircraft, then control circuit 128 may be configured to transition from a current state, such as the first state or the second state, to the third state. Control circuit 128 may identify state transition criterion corresponding to inactivity or dormancy of battery module based on an operating condition, such as, for example, no voltage and/or current being transferred between battery module 104 and electric aircraft.

Still referring to FIG. 1, a state transition criterion may be identified if an operating condition falls within a preconfigured range and/or threshold. For example, and without limitation, if an operating condition, which may include a quantitative value, is within a preconfigured first range, then a state transition criterion may allow control circuit 128 to determine that battery module 104 is active and, thus, control circuit operates in the first state. In another example, and without limitation, if an operating condition is within a preconfigured second range, then a state transition criterion may allow control circuit 128 to determine that battery module 104 is recharging and, thus, control circuit 128 operates in the second state. In another example, and without limitation, if an operating condition is within a preconfigured third range, then a state transition criterion may allow control circuit 128 to determine that battery module 104 is dormant and, thus, control circuit 128 operates in the third state.

Still referring to FIG. 1, control circuit 128 is configured to transition between operational states. Control circuit 128 may transition between operational states based on detected state transition criterion, as discussed further below in this disclosure. For the purposes of this disclosure, an "operational state", or "state", is a preconfigured state and/or mode of function of a control circuit and/or battery management system, where control circuit and/or battery management system operates differently in each operational state. For instance, and without limitations, control circuit 128 is configured to transition between operational states based on state transition criteria of battery pack 136 and/or battery module 104. For instance, and without limitation, control circuit 128 is configured to transition from a first state and a second state upon detecting a state transition criterion. In one or more embodiments, control circuit 128, when in the first state, operates at a first duty cycle. Furthermore, when in the first state, control circuit 128 communicates with first subset 124a of the plurality of sensors. In one or more embodiments, control circuit 128, when in the second state, operates at a second duty cycle and communicates with second subset 124b of the plurality of sensors, where the second duty cycle is distinct from the first duty cycle and the second subset is distinct from the first subset.

In one or more embodiments, first state may include an active state. For the purposes of this disclosure, an "active state" is a state used when an aircraft is being operated, such as flight or taxing. The duty cycle of the first state is higher than the duty cycle of each of the other states, such as the second state or the third state. For example, and without limitation, the duty cycle of the first state may include a 100% duty cycle. First subset 124a of plurality of sensors may include more sensors than other states, such as the first state and the second state. Thus, first subset 124a of the plurality of sensors may include more sensors than the second subset 124b and the second subset 124c. In various embodiments, first subset 124a of the plurality of sensors may include particular quantity of various types of sensors, as described in this disclosure, so that first subset 124a may monitor a large number of operating conditions of battery module 104. Therefore, first state may include identifying more operating conditions of battery module 104 than the second state or the third state. In some embodiments, first subset 124a of the plurality of sensors may include a particular quantity of the same type of sensors so that first subset 124a includes more sensors that second subset 124b, third subset 124c, or any other subsets. In some embodiments, first subset 124a may include a particular number of sensor suites and/or sensor arrays so that first subset 124a has more sensor suites and/or sensor arrays than second subset, third subset, or any other subset.

In one or more embodiments, the second state may include a recharging state. For the purposes of this disclosure, a "recharging state" is a state used when an energy source, such as a battery pack, of an electric aircraft is being recharged and/or connected to a charging station. The duty cycle of the second state is lower than the duty cycle of the first state, but higher than any of the remaining states, such as the third state. For example, and without limitation, the duty cycle of the second state may include a 40% duty cycle. Second subset 124b of the plurality of sensors may include less sensors than first subset 124b but more sensors than third subset 124c.

In one or more embodiments, the third state may include a dormant state. For the purposes of this disclosure, a "dormant state" is a state used when an energy source, such as a battery pack, is not in use by an electric aircraft or is disconnected from the aircraft. The duty cycle of the third state is lower than the duty cycle of the first state and the second state. For instance, and without limitation, the duty cycle of the third state may be the lowest duty cycle relative to the other duty cycles of the other states. For example, and without limitation, the duty cycle of the third state may include a 20% duty cycle. First subset 124a of plurality of sensors may include more sensors than other states, such as the first state and the second state. Thus, first subset 124a of the plurality of sensors may include more sensors than the second subset 124b and the second subset 124c.

In one or more embodiments, though state transition criterion is described as being based on measurement data corresponding to an operating condition of battery pack, state transition criterion may also be based on a received signal from a remote device, such as a mobile device, remote computer, control tower operator device, cockpit system, and the like. For example, a pilot may use a user interface of a device to command control circuit 128 to transition from one operational state to another operational state as desired.

Still referring to FIG. 1, in some embodiments, control circuit 128 is configured to determine a critical event element if operating condition is outside of a predetermined threshold (also referred to herein as a "threshold"). For the purposes of this disclosure, a "critical event element" is a failure and/or critical operating condition of a battery pack and/or components thereof that may be harmful to a battery pack and/or corresponding electric aircraft. For instance, and without limitation, if an identified operating condition, such as a temperature of a battery cell 304 of battery pack 136, does not fall within a predetermined threshold, such as a range of acceptable, operational temperatures of a battery cell, then a critical event element is determined by control circuit 128. For example, and without limitation, control circuit 128 may use measurement datum from plurality of sensors 124 to identify a temperature of 95° F. for a battery cell. If the predetermined temperature threshold is, for example, 75° F. to 90° F., then the determined operating condition is outside of the predetermined temperature threshold, such as exceeding the upper threshold of 90° F., and a critical event element is determined by control circuit 128. As used in this disclosure, a "predetermined threshold" is a limit and/or range of an acceptable quantitative value or representation related to a normal operating condition and/or state of a battery pack and/or components thereof. In one or more embodiments, an operating condition outside of a threshold is a critical operating condition, which triggers a critical event element. An operating condition within the threshold is a normal operating condition, which indicates that a battery pack is working properly and no critical event element is determined. For example, and without limitation, if an operating condition of temperature exceeds a predetermined temperature threshold of a battery pack, then the battery pack is considered to be operating at a critical operating condition and may be at risk of overheating and experiencing a catastrophic failure. In one or more embodiments, critical event elements may include high shock/drop, overtemperature, undervoltage, high moisture, contactor welding, and the like. Additional disclosure related to a pack monitoring system can be found in U.S. patent application Ser. No. 17/529,583 entitled "A PACK MONITORING UNIT FOR AN ELECTRIC AIRCRAFT BATTERY PACK AND METHODS OF USE FOR BATTERY MANAGEMENT", the entirety of which in incorporated herein by reference.

In one or more embodiments, control circuit 128 is configured to generate an action command in the case of a critical event element. For the purposes of this disclosure, an "action command" is a control signal generated by a controller that provides instructions related to reparative action needed to prevent and/or reduce damage to a battery back, components thereof, and/or aircraft as a result of a critical operating condition of the battery pack. Continuing the previously described example above, if an identified operating condition includes a temperature of 95° F., which exceeds a predetermined temperature threshold, then control circuit 128 may determine a critical event element indicating that battery pack 136 is working at a critical temperature level and at risk of catastrophic failure.

In one or more embodiments, control circuit may include a computing device (as discussed in FIG. 8), controller, a microcontroller, a low-power chip, a central processing unit (CPU), a microprocessor, a digital signal processor (DSP), an application specific integrated circuit (ASIC), a control circuit, a combination thereof, or the like. In one or more embodiments, output signals from various components of battery pack 136 may be analog or digital. Control circuit 128 may convert output signals from plurality of sensors 124 to a usable form by the destination of those signals. For example, and without limitation, control circuit 128 may include a switching regulator that converts power received from battery module 104 of battery pack 136. The usable form of output signals from MMUs and/or sensors, through processor may be either digital, analog, a combination thereof, or an otherwise unstated form. Processing may be configured to trim, offset, or otherwise compensate the outputs of sensor. Based on MMU and/or sensor output, controller 140 may determine the output to send to a downstream component. Control circuit 128 may include signal amplification, operational amplifier (Op-Amp), filter, digital/analog conversion, linearization circuit, current-voltage change circuits, resistance change circuits such as Wheatstone Bridge, an error compensator circuit, a combination thereof or otherwise undisclosed components. In one or more embodiments, control circuit 128 may run state estimation algorithms. In one or more embodiments, control circuit 128 may include a real time clock (RTC) that is used to track the current time and date, as discussed further in this disclosure.

Still referring to FIG. 1, BMS 100 includes a high voltage disconnect 132 communicatively connected to battery module 104, wherein high voltage disconnect 132 is configured to terminate power supply connection 112 between battery module 104 and electric aircraft in response to receiving an action command from control circuit 128. Control circuit 128 may be configured to determine a critical event element, such as high shock/drop, overtemperature, undervoltage, contactor welding, and the like. High voltage disconnect 132 is configured to receive action command generated by control circuit 128 and thus lock out battery pack 136 for maintenance in response to received action command. In one or more embodiments, control circuit 128 may create an alert, such as a lockout flag, which may be saved across reboots. A "lockout flag" may include an indicator alerting a user of a critical event element and subsequent termination of power supply connection 112 by high voltage disconnect 132. In one or more embodiments, a lockout flag may be saved in a memory component of control circuit 128 so that, despite rebooting battery pack 136 or complete loss of power of battery pack 136, power supply connection remains terminated and an alert regarding the termination remains. In one or more embodiments, an alert and/or lockout flag may be transmitted to a user device for viewing. For example, and without limitation, an alert may be shown on a mobile device, a laptop, a tablet, a display of an electric aircraft user interface, or the like. In one or more embodiments, lockout flag cannot be removed until a critical event element is no longer determined by control circuit 128. For, example, control circuit 128 may be continuously monitoring and updating an operating condition of battery module 104 and determining if operating condition is outside of a predetermined threshold. In one or more embodiments, lockout flag may include an alert on a graphic user interface of, for example, a remote computing device, such as a mobile device, tablet, laptop, desktop and the like. In other embodiments, lockout flag may be indicated to a user via an illuminated LED that is remote or locally located on battery pack 136. In one or more embodiments, control circuit 128 may include control of cell group balancing via MMUs, control of contactors (high voltage connections, etc.) control of welding detection, control of pyrofuses, and the like.

Still referring to FIG. 1, BMS 100 may include one or more low-power chips, where the low-power chips are configured to allow control circuit 128 to alternate between operational states using minimal amounts of energy. In one or more embodiments, control circuit 128 may include low-power chips. In other embodiments, control circuit 128 may be in communication with low-power chips. In one or more embodiments, low-power chips may include one or more of WiFi radios, nanomagnets, PICs, or the like. In one or more embodiments, low-power chips are configured to change and/or maintain an operation state of BMS 100, and/or components thereof, as a function of one or more operating conditions and/or transition state criterion. In one or more embodiments, low-power chip may be awakened by a watchdog timer. In one or more embodiments, one or more sensors may be communicatively connected to a pin that wakes BMS 100 if a detected operating condition exceeds a particular threshold.

In one or more exemplary embodiments, battery management system 100 may include a plurality of PMUs. For instance, and without limitation, battery management system 100 may include a pair of PMUs. For example, and without limitation, battery management system 100 may include a first PMU and a second PMU, which are each disposed in or on battery pack 136 and may be physically isolated from each other. "Physical isolation", for the purposes of this disclosure, refer to a first system's components, communicative connection, and any other constituent parts, whether software or hardware, are separated from a second system's components, communicative coupling, and any other constituent parts, whether software or hardware, respectively. In one or more embodiments, control circuit 128 may include a PMU. First PMU and second PMU may perform the same or different functions. For example, and without limitation, first and second PMUs may perform the same, and therefore, redundant functions. Thus, if one PMU fails or malfunctions, in whole or in part, the other PMU may still be operating properly and therefore battery management system 100 may still operate and function properly to manage battery pack 136. One of ordinary skill in the art would understand that the terms "first" and "second" do not refer to either PMU as primary or secondary. In non-limiting embodiments, the first and second PMUs, due to their physical isolation, may be configured to withstand malfunctions or failures in the other system and survive and operate. Provisions may be made to shield first PMU from second PMU other than physical location, such as structures and circuit fuses. In non-limiting embodiments, first PMU, second PMU, or subcomponents thereof may be disposed on an internal component or set of components within battery pack 136, such as on a battery module sense board, as discussed further below in this disclosure.

Still referring to FIG. 1, first PMU may be electrically isolated from second PMU. "Electrical isolation", for the purposes of this disclosure, refer to a first system's separation of components carrying electrical signals or electrical energy from a second system's components. First PMU may suffer an electrical catastrophe, rendering it inoperable, and due to electrical isolation, second may still continue to operate and function normally, allowing for continued management of battery pack 136 of electric aircraft. Shielding such as structural components, material selection, a combination thereof, or another undisclosed method of electrical isolation and insulation may be used, in non-limiting embodiments. For example, and without limitation, a rubber or other electrically insulating material component may be disposed between electrical components of first and second PMUs, preventing electrical energy to be conducted through it, isolating the first and second PMUs from each other. Similarly, MMUs may be physically and/or electrically isolated relative to each other and/or PMUs in case of failure of an MMU and/or PMU.

In one or more embodiments, a sensor 124 may include an MMU. For example, and without limitation, characteristics of battery module 104 may be detected by sensor 124, which may be communicatively connected to an MMU. Plurality of sensors 124 may include one or more sensor suites and/or arrays (shown in FIG. 4) or one or more individual sensors, which may include, but are not limited to, one or more temperature sensors, voltmeters, current sensors, hydrometers, infrared sensors, photoelectric sensors, ionization smoke sensors, motion sensors, pressure sensors, radiation sensors, level sensors, imaging devices, moisture sensors, gas and chemical sensors, flame sensors, electrical sensors, imaging sensors, force sensors, Hall sensors, airspeed sensors, throttle position sensors, and the like. Plurality of sensors 124 may be contact sensors, non-contact sensors, or a combination thereof. For example, and without limitation, sensors 124 may be connected to battery module 104 and/or battery cell 504 (as shown in FIG. 5B). In other embodiments, sensors 124 may be remote to battery module and/or battery cell. Sensors 124 may be communicatively connected to control circuit 128 so that sensors 124 may transmit/receive signals to/from control circuit 128, respectively. Signals, such as signals of sensors 124 and control circuit 128, may include electrical, electromagnetic, visual, audio, radio waves, or another undisclosed signal type alone or in combination. In one or more embodiments, communicatively connecting is a process whereby one device, component, or circuit is able to receive data from and/or transmit data to another device, component, or circuit. In an embodiment, communicative connecting includes electrically connecting at least an output of one device, component, or circuit to at least an input of another device, component, or circuit.

With continued reference to FIG. 1, battery management system 100 may include a memory component 144. In one or more embodiments, memory component 144 may be configured to store data related to battery pack 136, such as data related to battery modules 104a-n. For example, and without limitation, memory component 144 may store measurement datum, operating conditions, state transition criterion, critical event elements, lockout flags, and the like. Memory component 144 may include a database. Memory component 144 may include a solid-state memory or tape hard drive. Memory component 144 may be communicatively connected to control circuit 128 and may be configured to receive electrical signals related to physical or electrical phenomenon measured and store those electrical signals as battery module data. Alternatively, memory component 144 may be a plurality of discrete memory components that are physically and electrically isolated from each other. One of ordinary skill in the art would understand the virtually limitless arrangements of data stores with which battery pack 136 could employ to store battery pack data. Battery pack data may include be generated data, detected data, measured data, inputted data, and the like. For example, measurement datum may be stored in memory component 144. In another example, critical event element and/or corresponding lockout flag may be stored in memory component 144. Battery pack data may also include inputted datum, which may include total flight hours that battery pack 136 and/or electric aircraft have been operating, flight plan of electric aircraft, battery pack identification, battery pack verification, a battery pack maintenance history, battery pack specifications, or the like. In one or more embodiments, battery pack maintenance history may include mechanical failures and technician resolutions thereof, electrical failures and technician resolutions thereof. Additionally, battery pack maintenance history may include component failures such that the overall battery pack still functions. In one or more embodiments, memory component 144 may be communicatively connected to sensors, such as sensors 124, that detect, measure, and obtain a plurality of measurements, which may include current, voltage, resistance, impedance, coulombs, watts, temperature, moisture/humidity, or a combination thereof. Additionally, or alternatively, memory component 144 may be communicatively connected to a sensor suite consistent with this disclosure to measure physical and/or electrical characteristics. In one or more embodiments, memory component 144 may store battery pack data that includes an upper threshold and a lower threshold of a state and/or condition consistent with this disclosure. In one or more exemplary embodiments, battery pack data may include a moisture-level threshold. The moisture-level threshold may include an absolute, relative, and/or specific moisture-level threshold. In other exemplary embodiments, battery pack data may include a temperature threshold. In other exemplary embodiments, battery pack data may include a high-shock threshold.

In one or more embodiments, memory component 144 may be configured to save measurement datum, operating condition, state transition criteria, critical event element, and the like periodically in regular intervals to memory component 144. "Regular intervals", for the purposes of this disclosure, refers to an event taking place repeatedly after a certain amount of elapsed time. In one or more embodiments, control circuit 128 may include a timer that works in conjunction to determine regular intervals. In other embodiments, PMU may continuously update operating condition or critical event element and, thus, continuously store data related the information in memory component. A timer may include a timing circuit, internal clock, or other circuit, component, or part configured to keep track of elapsed time and/or time of day. For example, in non-limiting embodiments, memory component 144 may save the first and second battery pack data every 30 seconds, every minute, every 30 minutes, or another time period according to timer. Additionally or alternatively, memory component 144 may save battery pack data after certain events occur, for example, in non-limiting embodiments, each power cycle, landing of the electric aircraft, when battery pack is charging or discharging, a failure of battery module, a malfunction of battery module, a critical event element, or scheduled maintenance periods. In non-limiting embodiments, battery pack 136 phenomena may be continuously measured and stored at an intermediary storage location, and then permanently saved by memory component 144 at a later time, like at a regular interval or after an event has taken place as disclosed hereinabove. Additionally or alternatively, data storage system may be configured to save battery pack data at a predetermined time. "Predetermined time", for the purposes of this disclosure, refers to an internal clock within battery pack commanding memory component 144 to save battery pack data at that time.

In one or more embodiments, high voltage disconnect may include a bus. A "bus", for the purposes of this disclosure and in electrical parlance is any common connection to which any number of loads, which may be connected in parallel, and share a relatively similar voltage may be electrically coupled. Bus may be responsible for conveying electrical energy stored in battery pack 136 to at least a portion of an electric aircraft, as discussed previously in this disclosure. High voltage disconnect may include a ground fault detection, a high voltage current sense 412, a high voltage pyro fuse, a high voltage contactor, and the like. High voltage disconnect 132 may physically and/or electrically breaks power supply communication between electric aircraft and battery module 104 of battery pack 136. In one or more embodiments, in one or more embodiments, the termination of power supply connection 112 may be restored by high voltage disconnect 132 once control circuit 128 no longer determine a critical event element. In other embodiments, power supply connection 112 may be restored manually, such as by a user.

In one or more embodiments, control circuit 128 may conduct reparative procedures after determining critical even element to reduce or eliminate critical element event. For example, and without limitation, control circuit 128 may initiate reparative procedure of a circulation of a coolant through a cooling system of battery pack 136 to lower a temperature of a battery module if the determined temperature of the battery module exceeds a predetermined temperature threshold. In another example, and without limitation, if a fluid accumulation level is detected that is then determined to exceed a predetermined byproduct threshold, then high voltage disconnect 132 may terminate power supply connection 112. According to some embodiments, a vent of battery pack 136 may be opened to circulate air through battery pack 136 and reduce detected gas levels. Additionally, vent of battery module 104 may have a vacuum applied to aid in venting of a byproduct, such as ejecta. Vacuum pressure differential may range from 0.1"Hg to 36"Hg.

Figure 2:
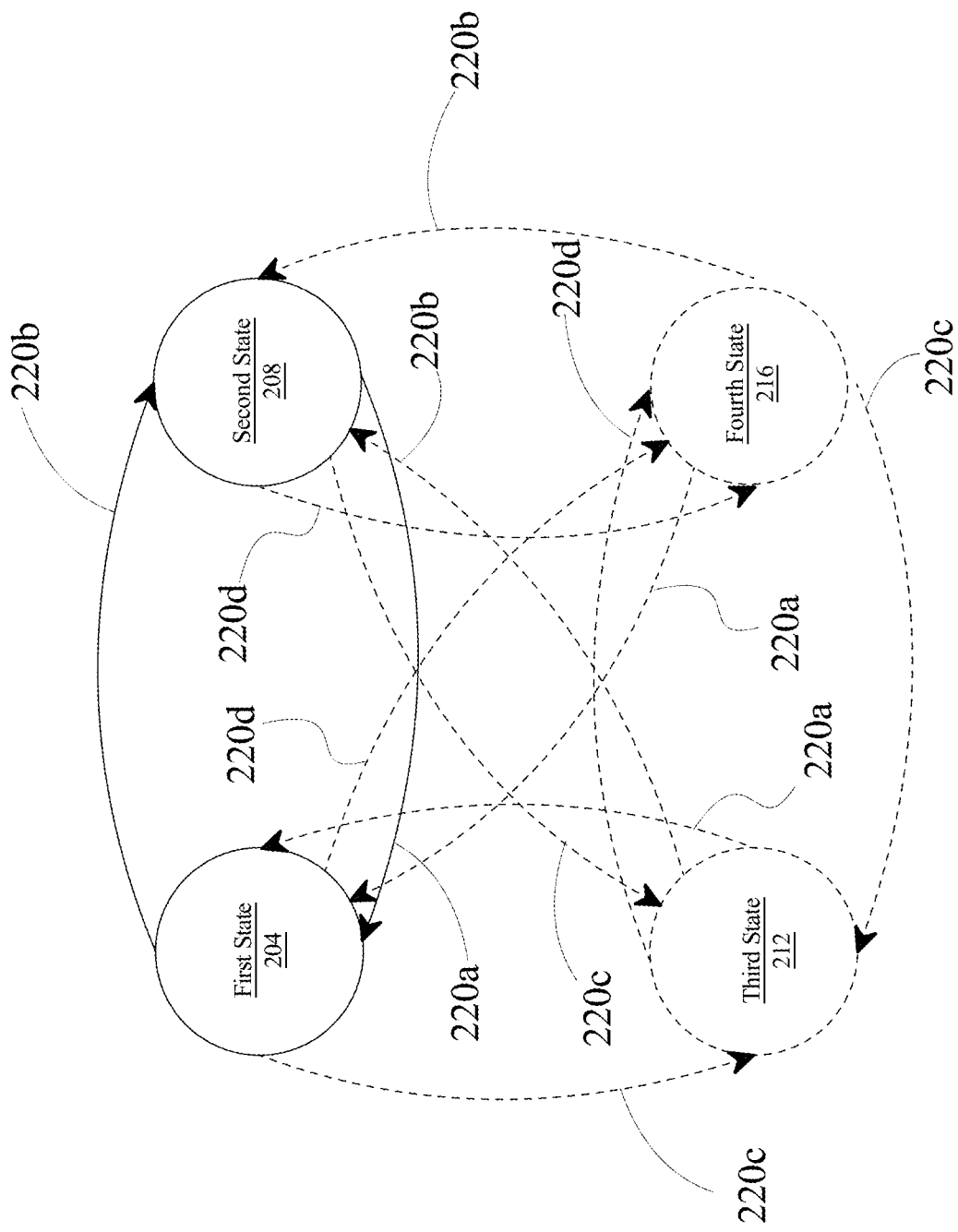
FIG. 2 is an illustration of an exemplary embodiment of a sensor suite in partial cut-off view in one or more aspects of the present disclosure.

Now referring to FIG. 2, a diagram illustrating transitions between exemplary operational states of control circuit 128 are shown. Control circuit 128 may transition from first state 204 to second state 206, third state 212, fourth state 216, or any other operational states (as indicated by the directional arrows). Control circuit 128 may transition from first state 204 to another state based on state transition criterion, as previously described in this disclosure. In one or more embodiments, control circuit 128 may transition from second state 206 to first state 204, third state 212, fourth state 216, or any other operational states. Control circuit 128 may transition from third state 212 to second state 206, first state 204, fourth state 216, or any other operational. Control circuit 128 may transition from fourth state 216 to second state 206, third state 212, first state 204, or any other operational states. As understood by one of ordinary skill in the art, though four operational states are illustrated, control circuit 128 may include any number of operational states that control circuit 128 may transition between.

Still referring to FIG. 2, in one or more exemplary embodiments, state transition criterion 220c may indicate a disconnection or inactivation of battery pack 136. In response, control circuit 128 may operate in third state 312. In the third state, BMS 100, and/or components thereof, may be dormant unless "awakened" by low-power chip, as previously discussed. In some embodiments, BMS 100 may be awakened if a detected transition state criterion is within a preconfigured range. In other embodiments, BMS 100 may be awakened by a watchdog timer that awakens control circuit 128 at intermittent intervals. An intermittent interval may include, for example, every ten minutes, every hour, every day, and the like. In other embodiments, control chip 128 may be awakened at irregular intervals. In other embodiments, control chip 128 make be awakened by a critical event element determination. When control chip 128 is awakened, battery management system 100 may perform a health check, which includes checking various operating conditions and identifying a state transition criterion. For example, and without limitation, the health check may include taking various measurements of the battery modules 104a-n, as discussed previously in this disclosure. In some cases, battery management system 100 may log these results locally. For example, BMS 100 may save operating conditions, state transition criterion, or critical event elements in a memory component of BMS 100, as described further below. In other embodiments, BMS 100 may store these results in a remote database using a network.

In exemplary embodiments, transition state criterion 220b may indicate that battery pack 136 is being charged by, for example and without limitation, a charging station. In some embodiments, operating condition may include a voltage supply, a rate of increase or decrease in SOC of battery pack, and the like for control circuit 128 to identify state transition criterion 220b indicating that battery pack 136 is being charged. In other embodiments, state transition criterion 220b may indicate that voltage supply is outside of a preconfigured range and, thus, that BMS 100 should be switch to a different operational state. When battery pack 136 is being charged by another power source or charging another power source, then battery management system 100 is switched to and operates in a second state, as previously mentioned in this disclosure. For example, and without limitation, BMS 100 may operate at second state 208 when one or more battery modules 104a-n are being charged. Second state 208 may include a state of function of BMS and/or control circuit resulting in BMS monitoring a particular amount and or type of operating conditions of battery pack and/or components thereof. For example, and without limitation, when operating in second state 208, BMS 100 may only monitor a temperature, current, voltage, SOC, and the like, during charging of battery pack 136.

In one or more embodiments, state transition criterion 220a may indicate that battery pack 136 is active and being used for operation of electric aircraft, such as to facilitate flight of electric aircraft. An operating condition when battery pack is being used to power electric aircraft for flight may include an increase in temperature of battery pack, a decrease in SOC of battery pack, an output of voltage of battery modules, and the like. When battery pack 136 is being used to power electric aircraft during operation of electric aircraft, such as during flight or taxing, low-power chip may provide power to transition control circuit 128 from a current operational state to first state 204. When operating in first state 202, control circuit 128 may monitor a larger number of operating conditions of battery modules 104a-n and/or at a higher frequency than when operating in the other states, such as second state 208, third state 212, or fourth state 216. In first state 204, a wide variety and/or larger number of sensors may be monitoring the operating conditions of each battery module 104a-n. For example, BMS 100 may monitor the SOC, voltage, battery pack temperature, ambient temperature, environmental pressure, humidity levels, gas levels, and the like, of battery module.

In one or more embodiments, state transition criterion 220d may indicate that battery pack 136 is operating in a critical state, where a critical event has been determined by control circuit 128, as previously described in this disclosure. Thus, BMS 100 may operate in a fourth state 216 so that BMS may monitor a particular operating condition of battery pack 136 that is in critical condition. In some embodiments, only particular types of sensors may be active and transmitting measurement data to control circuit 128 based on the component of battery pack 136 that requires monitoring by BMS 100.

Figure 3:
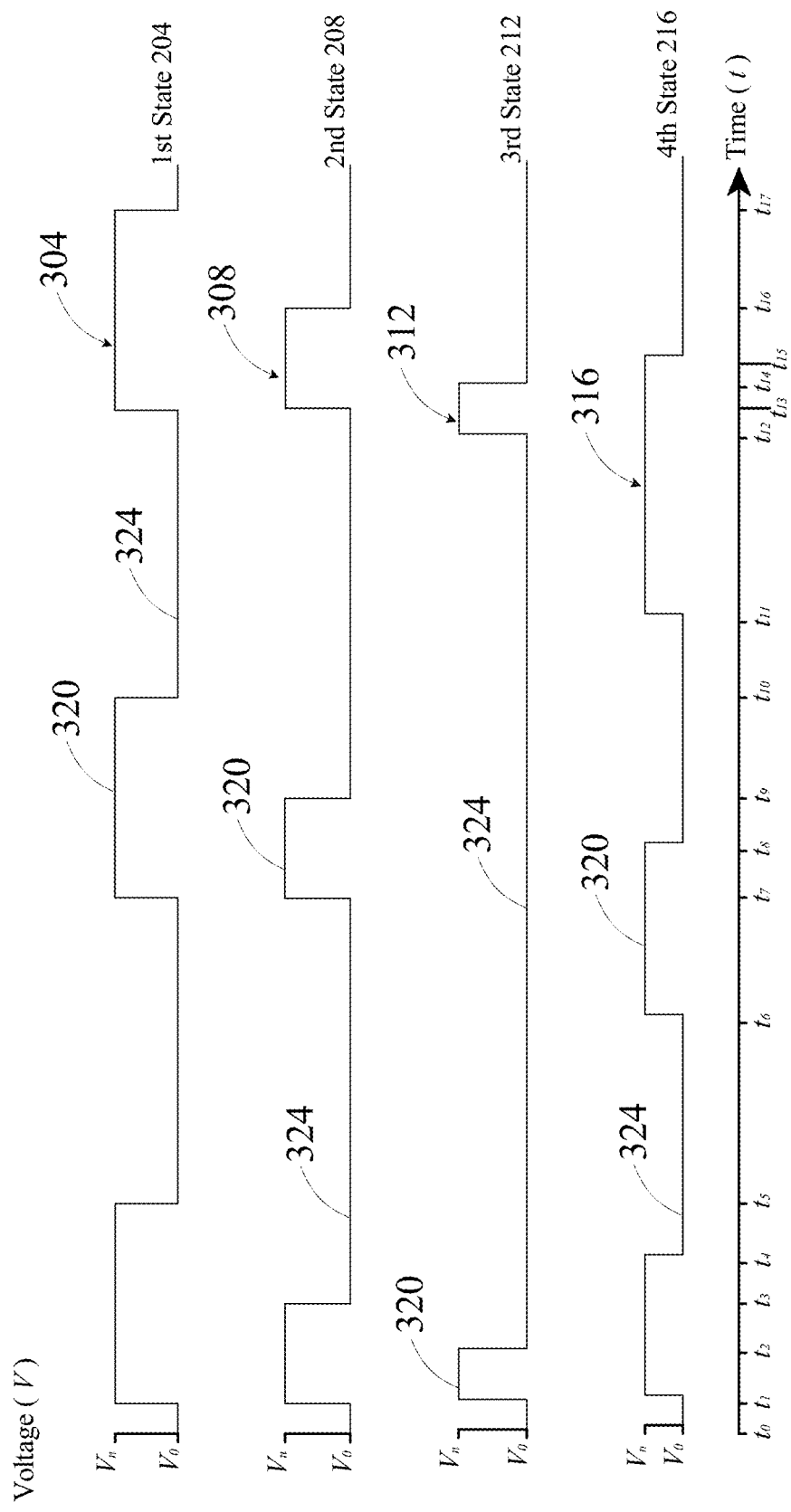
FIG. 3 is a diagram of an exemplary embodiment of state transitions of the battery management system in or one more aspects of the present disclosure.

Now referring to FIG. 3, graphs representing exemplary duty cycles of each operational states are shown. In various embodiments, control circuit 128 is configured to transition between operational states based on state transition criteria of battery pack 136 and/or battery modules 104a-n. In one or more embodiments, control circuit 128, when in the first state 204, operates at a first duty cycle 304. As shown understood by one of ordinary skill in the art, a duty cycle may include a ratio between a pulse duration and a period of time of a rectangular waveform. The active time 320 of BMS 100, such as active time of control circuit 128 and/or sensors 124, may include the duration which power is provided to BMS 100, such as by a low-power chip, and/or when BMS 100 is actively monitoring operation conditions of battery pack 136 and/or battery modules 104a-n. In some embodiments, duty cycle 304 of first state 204 may include a 50% duty cycle, as shown in FIG. 3, where BMS 100 is on and/or monitoring operating conditions of battery pack 136 50% of the time and BMS is off, the inactive time 324, or not monitoring operating conditions of battery pack 136 the other 50% of the time. In other embodiments, first duty cycle 304 of first state 204 may include a 100% duty cycle (not shown), where BMS 100 is continuously monitoring operating conditions of battery pack 136 and/or there is a continuous power supply to BMS 100 and/or control circuit 128.

Still referring to FIG. 3, in one or more embodiments, control circuit 128, when in the second state 206, operates at a second duty cycle 306 and communicates with second subset 124b of the plurality of sensors, where second duty cycle 306 is distinct from first duty cycle 304 and second subset 124b is distinct from first subset 124a. As shown in FIG. 3, second duty cycle 306 of second state 206 may be less than first duty cycle 304, where BMS 100 and/or control circuit 128 is active and/or supplied power for less time than in first duty cycle 304. In an exemplary embodiment, second duty cycle 306 may include a duty cycle of 40%, where a power signal is provided to control circuit 128 for 40% of the time over a specific duration of time and is not receiving a power signal for 60% of the time over a specific duration of time.

Still referring to FIG. 3, in one or more embodiments, control circuit 128, when in the third state 212, operates at a third duty cycle 312 and communicates with third subset 124c of the plurality of sensors, where third duty cycle 312 is distinct from first duty cycle 304 and second duty cycle 306, and third subset 124c is distinct from first subset 124a and second subset 124b. As shown in FIG. 3, third duty cycle 312 of third state 212 may be less than first duty cycle 304 and second duty cycle 306, where BMS 100 and/or control circuit 128 is active and/or supplied power for less time than in first duty cycle 304 and second duty cycle 306. In an exemplary embodiment, third duty cycle 312 may include a duty cycle of 20%, where a power signal is provided to control circuit 128 for 20% of the time over a specific duration of time and is not receiving a power signal for 80% of the time over a specific duration of time. In some embodiments, in third state 212, duty cycle may be 0%, where no power is supplied to BMS 100 unless a watchdog time or command signal from a remote device activates control circuit 128.

Still referring to FIG. 3, in one or more embodiments, control circuit 128, when in the fourth state 216, operates at a fourth duty cycle 316 and communicates with a fourth subset 124 of the plurality of sensors, where fourth duty cycle 316 is distinct from the other duty cycles and fourth subset is distinct from the other subsets of the plurality of sensors 124. In some embodiments, fourth duty cycle 316 may include variable pulse widths.

Figure 4:
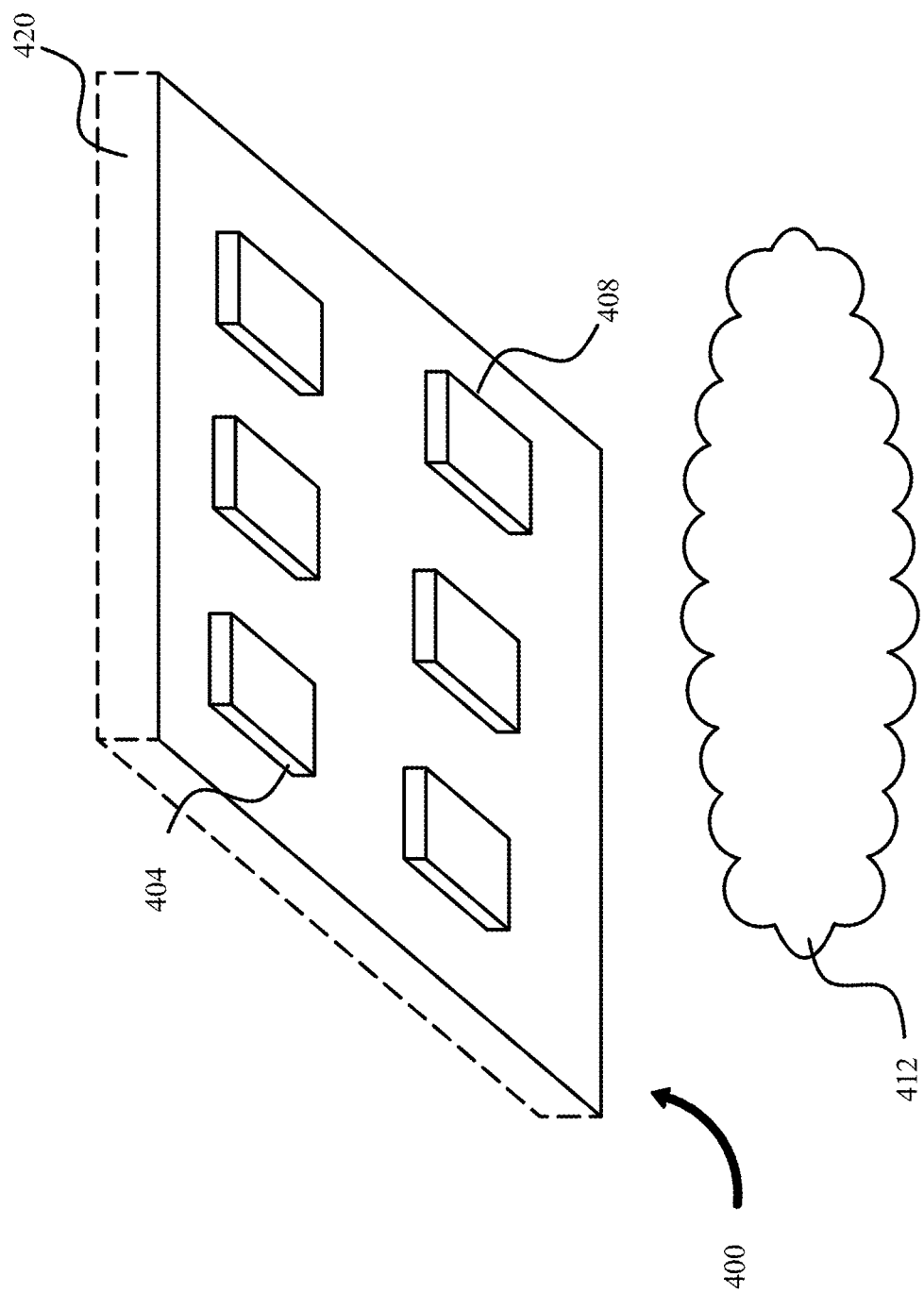
FIG. 4 is a diagram of exemplary embodiments of duty cycles various operation states in one or more aspects of the present disclosure.

Referring now to FIG. 4, an embodiment of sensor suite 400 is presented. The herein disclosed system and method may comprise a plurality of sensors in the form of individual sensors or a sensor suite working in tandem or individually. A sensor suite may include a plurality of independent sensors, as described herein, where any number of the described sensors may be used to detect any number of physical or electrical quantities associated with an aircraft power system or an electrical energy storage system. Independent sensors may include separate sensors measuring physical or electrical quantities that may be powered by and/or in communication with circuits independently, where each may signal sensor output to a control circuit such as a user graphical interface. In a non-limiting example, there may be four independent sensors housed in and/or on battery pack 136 measuring temperature, electrical characteristic such as voltage, amperage, resistance, or impedance, or any other parameters and/or quantities as described in this disclosure. In an embodiment, use of a plurality of independent sensors may result in redundancy configured to employ more than one sensor that measures the same phenomenon, those sensors being of the same type, a combination of, or another type of sensor not disclosed, so that in the event one sensor fails, the ability of battery management system 100 and/or user to detect phenomenon is maintained and in a non-limiting example, a user alter aircraft usage pursuant to sensor readings.

Sensor suite 400 may be suitable for use as sensor 124 as disclosed with reference to FIG. 1 hereinabove. Sensor suite 400 includes a moisture sensor 404. "Moisture", as used in this disclosure, is the presence of water, this may include vaporized water in air, condensation on the surfaces of objects, or concentrations of liquid water. Moisture may include humidity. "Humidity", as used in this disclosure, is the property of a gaseous medium (almost always air) to hold water in the form of vapor. An amount of water vapor contained within a parcel of air can vary significantly. Water vapor is generally invisible to the human eye and may be damaging to electrical components. There are three primary measurements of humidity, absolute, relative, specific humidity. "Absolute humidity," for the purposes of this disclosure, describes the water content of air and is expressed in either grams per cubic meters or grams per kilogram. "Relative humidity", for the purposes of this disclosure, is expressed as a percentage, indicating a present stat of absolute humidity relative to a maximum humidity given the same temperature. "Specific humidity", for the purposes of this disclosure, is the ratio of water vapor mass to total moist air parcel mass, where parcel is a given portion of a gaseous medium. Moisture sensor 404 may be psychrometer. Moisture sensor 404 may be a hygrometer. Moisture sensor 404 may be configured to act as or include a humidistat. A "humidistat", for the purposes of this disclosure, is a humidity-triggered switch, often used to control another electronic device. Moisture sensor 404 may use capacitance to measure relative humidity and include in itself, or as an external component, include a device to convert relative humidity measurements to absolute humidity measurements. "Capacitance", for the purposes of this disclosure, is the ability of a system to store an electric charge, in this case the system is a parcel of air which may be near, adjacent to, or above a battery cell.

With continued reference to FIG. 4, sensor suite 400 may include electrical sensors 408. Electrical sensors 408 may be configured to measure voltage across a component, electrical current through a component, and resistance of a component. Electrical sensors 408 may include separate sensors to measure each of the previously disclosed electrical characteristics such as voltmeter, ammeter, and ohmmeter, respectively.

Alternatively or additionally, and with continued reference to FIG. 4, sensor suite 400 include a sensor or plurality thereof that may detect voltage and direct the charging of individual battery cells according to charge level; detection may be performed using any suitable component, set of components, and/or mechanism for direct or indirect measurement and/or detection of voltage levels, including without limitation comparators, analog to digital converters, any form of voltmeter, or the like. Sensor suite 400 and/or a control circuit incorporated therein and/or communicatively connected thereto may be configured to adjust charge to one or more battery cells as a function of a charge level and/or a detected parameter. For instance, and without limitation, sensor suite 400 may be configured to determine that a charge level of a battery cell is high based on a detected voltage level of that battery cell or portion of the battery pack. Sensor suite 400 may alternatively or additionally detect a charge reduction event, defined for purposes of this disclosure as any temporary or permanent state of a battery cell requiring reduction or cessation of charging; a charge reduction event may include a cell being fully charged and/or a cell undergoing a physical and/or electrical process that makes continued charging at a current voltage and/or current level inadvisable due to a risk that the cell will be damaged, will overheat, or the like. Detection of a charge reduction event may include detection of a temperature, of the cell above a threshold level, detection of a voltage and/or resistance level above or below a threshold, or the like. Sensor suite 400 may include digital sensors, analog sensors, or a combination thereof. Sensor suite 400 may include digital-to-analog converters (DAC), analog-to-digital converters (ADC, A/D, A-to-D), a combination thereof, or other signal conditioning components used in transmission of a first plurality of battery pack data to a destination over wireless or wired connection.

With continued reference to FIG. 4, sensor suite 400 may include thermocouples, thermistors, thermometers, passive infrared sensors, resistance temperature sensors (RTDs), semiconductor based integrated circuits (IC), a combination thereof or another undisclosed sensor type, alone or in combination. Temperature, for the purposes of this disclosure, and as would be appreciated by someone of ordinary skill in the art, is a measure of the heat energy of a system. Temperature, as measured by any number or combinations of sensors present within sensor suite 400, may be measured in Fahrenheit (° F.), Celsius (° C.), Kelvin (° K), or another scale alone or in combination. The temperature measured by sensors may comprise electrical signals which are transmitted to their appropriate destination wireless or through a wired connection.

With continued reference to FIG. 4, sensor suite 400 may include a sensor configured to detect gas that may be emitted during or after a cell failure. "Cell failure", for the purposes of this disclosure, refers to a malfunction of a battery cell, which may be an electrochemical cell, that renders the cell inoperable for its designed function, namely providing electrical energy to at least a portion of an electric aircraft. Byproducts 412 of cell failure may include gaseous discharge including oxygen, hydrogen, carbon dioxide, methane, carbon monoxide, a combination thereof, or another undisclosed gas, alone or in combination. Further the sensor configured to detect vent gas from electrochemical cells may comprise a gas detector. For the purposes of this disclosure, a "gas detector" is a device used to detect a gas is present in an area. Gas detectors, and more specifically, the gas sensor that may be used in sensor suite 400, may be configured to detect combustible, flammable, toxic, oxygen depleted, a combination thereof, or another type of gas alone or in combination. The gas sensor that may be present in sensor suite 400 may include a combustible gas, photoionization detectors, electrochemical gas sensors, ultrasonic sensors, metal-oxide-semiconductor (MOS) sensors, infrared imaging sensors, a combination thereof, or another undisclosed type of gas sensor alone or in combination. Sensor suite 400 may include sensors that are configured to detect non-gaseous byproducts 412 of cell failure including, in non-limiting examples, liquid chemical leaks including aqueous alkaline solution, ionomer, molten phosphoric acid, liquid electrolytes with redox shuttle and ionomer, and salt water, among others. Sensor suite 400 may include sensors that are configured to detect non-gaseous byproducts 412 of cell failure including, in non-limiting examples, electrical anomalies as detected by any of the previous disclosed sensors or components.

With continued reference to FIG. 4, sensor suite 400 may be configured to detect events where voltage nears an upper voltage threshold or lower voltage threshold. The upper voltage threshold may be stored in memory component 144 for comparison with an instant measurement taken by any combination of sensors present within sensor suite 400. The upper voltage threshold may be calculated and calibrated based on factors relating to battery cell health, maintenance history, location within battery pack, designed application, and type, among others. Sensor suite 400 may measure voltage at an instant, over a period of time, or periodically. Sensor suite 400 may be configured to operate at any of these detection modes, switch between modes, or simultaneous measure in more than one mode. In one or more exemplary embodiments, control circuit 128 may determine, using sensor suite 400, a critical event element where voltage nears the lower voltage threshold. The lower voltage threshold may indicate power loss to or from an individual battery cell or portion of the battery pack. Control circuit 128 may determine through sensor suite 400 critical event elements where voltage exceeds the upper and lower voltage threshold. Events where voltage exceeds the upper and lower voltage threshold may indicate battery cell failure or electrical anomalies that could lead to potentially dangerous situations for aircraft and personnel that may be present in or near its operation.

In one or more embodiments, sensor suite 400 may include an inertial measurement unit (IMU). In one or more embodiments, an IMU may be configured to detect a change in specific force of a body. An IMU may include an accelerometer, a gyro sensor, a magnetometer, an E-compass, a G-sensor, a geomagnetic sensor, and the like. An IMU may be configured to obtain measurement datum. Control circuit 128 may determine a critical event element by if, for example, an accelerometer of sensor suite 400 detects a force experienced by battery pack 136 that exceeds a predetermined threshold.

Figure 5A:
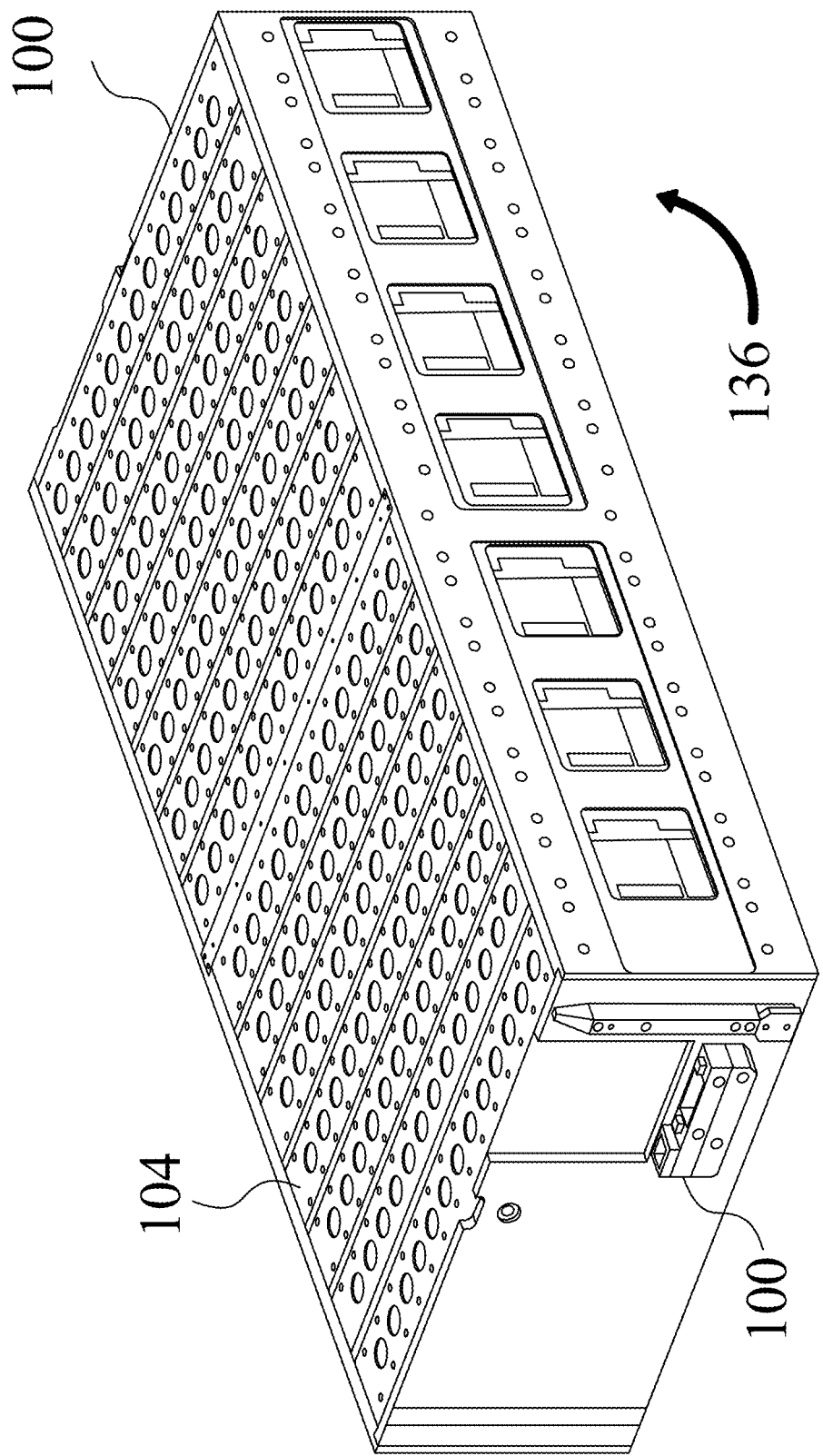
FIGS. 5A and 5B are illustrations of exemplary embodiments of battery pack configured for use in an electric aircraft in isometric view in accordance with one or more aspects of the present disclosure.
Figure 5B:
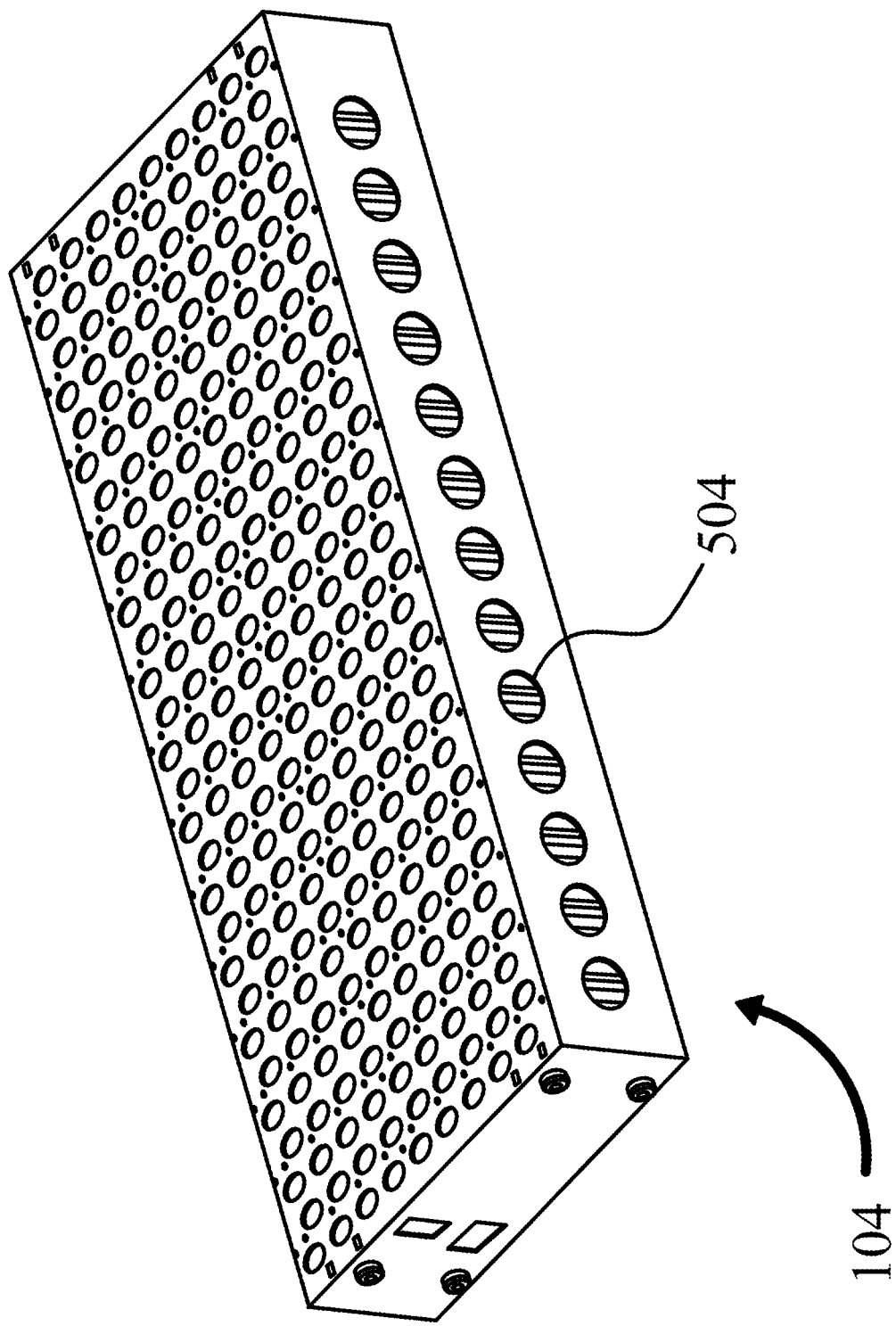

Now referring to FIGS. 5A and 5B, an exemplary embodiment of an eVTOL aircraft battery pack is illustrated. Battery pack 136 is a power source that may be configured to store electrical energy in the form of a plurality of battery modules, which themselves include of a plurality of electrochemical cells. These cells may utilize electrochemical cells, galvanic cells, electrolytic cells, fuel cells, flow cells, pouch cells, and/or voltaic cells. In general, an electrochemical cell is a device capable of generating electrical energy from chemical reactions or using electrical energy to cause chemical reactions, this disclosure will focus on the former. Voltaic or galvanic cells are electrochemical cells that generate electric current from chemical reactions, while electrolytic cells generate chemical reactions via electrolysis. In general, the term "battery" is used as a collection of cells connected in series or parallel to each other. A battery cell may, when used in conjunction with other cells, may be electrically connected in series, in parallel or a combination of series and parallel. Series connection includes wiring a first terminal of a first cell to a second terminal of a second cell and further configured to include a single conductive path for electricity to flow while maintaining the same current (measured in Amperes) through any component in the circuit. A battery cell may use the term "wired", but one of ordinary skill in the art would appreciate that this term is synonymous with "electrically connected", and that there are many ways to couple electrical elements like battery cells together. An example of a connector that does not include wires may be prefabricated terminals of a first gender that mate with a second terminal with a second gender. Battery cells may be wired in parallel. Parallel connection includes wiring a first and second terminal of a first battery cell to a first and second terminal of a second battery cell and further configured to include more than one conductive path for electricity to flow while maintaining the same voltage (measured in Volts) across any component in the circuit. Battery cells may be wired in a series-parallel circuit which combines characteristics of the constituent circuit types to this combination circuit. Battery cells may be electrically connected in a virtually unlimited arrangement which may confer onto the system the electrical advantages associated with that arrangement such as high-voltage applications, high-current applications, or the like. In an exemplary embodiment, and without limitation, battery pack 136 include 196 battery cells in series and 18 battery cells in parallel. This is, as someone of ordinary skill in the art would appreciate, is only an example and battery pack 136 may be configured to have a near limitless arrangement of battery cell configurations. Battery pack 136 may be designed to the Federal Aviation Administration (FAA)'s Design Assurance Level A (DAL-A), using redundant DAL-B subsystems.

With continued reference to FIGS. 5A and 5B, battery pack 136 may include a plurality of battery modules 104. Battery modules 104 may be wired together in series and in parallel. Battery pack 136 may include a center sheet which may include a thin barrier. The barrier may include a fuse connecting battery modules on either side of the center sheet. The fuse may be disposed in or on the center sheet and configured to connect to an electric circuit comprising a first battery module and therefore battery unit and cells. In general, and for the purposes of this disclosure, a fuse is an electrical safety device that operate to provide overcurrent protection of an electrical circuit. As a sacrificial device, its essential component is metal wire or strip that melts when too much current flows through it, thereby interrupting energy flow. The fuse may include a thermal fuse, mechanical fuse, blade fuse, expulsion fuse, spark gap surge arrestor, varistor, or a combination thereof.

Battery pack 136 may also include a side wall includes a laminate of a plurality of layers configured to thermally insulate the plurality of battery modules from external components of battery pack 136. The side wall layers may include materials which possess characteristics suitable for thermal insulation as described in the entirety of this disclosure like fiberglass, air, iron fibers, polystyrene foam, and thin plastic films, to name a few. The side wall may additionally or alternatively electrically insulate the plurality of battery modules from external components of battery pack 136 and the layers of which may include polyvinyl chloride (PVC), glass, asbestos, rigid laminate, varnish, resin, paper, Teflon, rubber, and mechanical lamina. The center sheet may be mechanically coupled to the side wall in any manner described in the entirety of this disclosure or otherwise undisclosed methods, alone or in combination. The side wall may include a feature for alignment and coupling to the center sheet. This feature may include a cutout, slots, holes, bosses, ridges, channels, and/or other undisclosed mechanical features, alone or in combination.

With continued reference to FIGS. 5A and 5B, battery pack 136 may also include an end panel 504 including a plurality of electrical connectors and further configured to fix battery pack 136 in alignment with at least the side wall. End panel 504 may include a plurality of electrical connectors of a first gender configured to electrically and mechanically connect to electrical connectors of a second gender. The end panel may be configured to convey electrical energy from battery cells to at least a portion of an eVTOL aircraft, for example, using high voltage disconnect 132. Electrical energy may be configured to power at least a portion of an eVTOL aircraft or include signals to notify aircraft computers, personnel, users, pilots, and any others of information regarding battery health, emergencies, and/or electrical characteristics. The plurality of electrical connectors may include blind mate connectors, plug and socket connectors, screw terminals, ring and spade connectors, blade connectors, and/or an undisclosed type alone or in combination. The electrical connectors of which the end panel includes may be configured for power and communication purposes. A first end of the end panel may be configured to mechanically couple to a first end of a first side wall by a snap attachment mechanism, similar to end cap and side panel configuration utilized in the battery module. To reiterate, a protrusion disposed in or on the end panel may be captured, at least in part, by a receptacle disposed in or on the side wall. A second end of end the panel may be mechanically coupled to a second end of a second side wall in a similar or the same mechanism.

With continued reference to FIGS. 5A and 5B, sensor suite 400 may be disposed in or on a portion of battery pack 136 near battery modules or battery cells. In one or more embodiments, control circuit 128 may be configured to communicate with an electric aircraft, such as a flight controller of electric aircraft, using a controller area network (CAN), such as by using a CAN transceiver 424 as shown in FIG. 4. In one or more embodiments, a controller area network may include a bus. Bus may include an electrical bus. Bus may refer to power busses, audio busses, video busses, computing address busses, and/or data busses. Bus may be additionally or alternatively responsible for conveying electrical signals generated by any number of components within battery pack 136 to any destination on or offboard an electric aircraft. Battery management system 100 may include wiring or conductive surfaces only in portions required to electrically couple bus to electrical power or necessary circuits to convey that power or signals to their destinations.

Outputs from sensors or any other component present within system may be analog or digital. Onboard or remotely located processors can convert those output signals from sensor suite to a usable form by the destination of those signals. The usable form of output signals from sensors, through processor may be either digital, analog, a combination thereof or an otherwise unstated form. Processing may be configured to trim, offset, or otherwise compensate the outputs of sensor suite. Based on sensor output, the processor can determine the output to send to downstream component. Processor can include signal amplification, operational amplifier (Op-Amp), filter, digital/analog conversion, linearization circuit, current-voltage change circuits, resistance change circuits such as Wheatstone Bridge, an error compensator circuit, a combination thereof or otherwise undisclosed components.

With continued reference to FIGS. 5A and 5B, any of the disclosed components or systems, namely battery pack 136, control circuit 128, and/or battery cell 304 may incorporate provisions to dissipate heat energy present due to electrical resistance in integral circuit. Battery pack 136 includes one or more battery element modules wired in series and/or parallel. The presence of a voltage difference and associated amperage inevitably will increase heat energy present in and around battery pack 136 as a whole. The presence of heat energy in a power system is potentially dangerous by introducing energy possibly sufficient to damage mechanical, electrical, and/or other systems present in at least a portion of an electric aircraft. Battery pack 136 may include mechanical design elements, one of ordinary skill in the art, may thermodynamically dissipate heat energy away from battery pack 136. The mechanical design may include, but is not limited to, slots, fins, heat sinks, perforations, a combination thereof, or another undisclosed element.

Heat dissipation may include material selection beneficial to move heat energy in a suitable manner for operation of battery pack 136. Certain materials with specific atomic structures and therefore specific elemental or alloyed properties and characteristics may be selected in construction of battery pack 136 to transfer heat energy out of a vulnerable location or selected to withstand certain levels of heat energy output that may potentially damage an otherwise unprotected component. One of ordinary skill in the art, after reading the entirety of this disclosure would understand that material selection may include titanium, steel alloys, nickel, copper, nickel-copper alloys such as Monel, tantalum and tantalum alloys, tungsten and tungsten alloys such as Inconel, a combination thereof, or another undisclosed material or combination thereof. Heat dissipation may include a combination of mechanical design and material selection. The responsibility of heat dissipation may fall upon the material selection and design as disclosed above in regard to any component disclosed in this paper. The battery pack 136 may include similar or identical features and materials ascribed to battery pack 136 in order to manage the heat energy produced by these systems and components.

According to embodiments, the circuitry disposed within or on battery pack 136 may be shielded from electromagnetic interference. The battery elements and associated circuitry may be shielded by material such as mylar, aluminum, copper a combination thereof, or another suitable material. The battery pack 136 and associated circuitry may include one or more of the aforementioned materials in their inherent construction or additionally added after manufacture for the express purpose of shielding a vulnerable component. The battery pack 136 and associated circuitry may alternatively or additionally be shielded by location. Electrochemical interference shielding by location includes a design configured to separate a potentially vulnerable component from energy that may compromise the function of said component. The location of vulnerable component may be a physical uninterrupted distance away from an interfering energy source, or location configured to include a shielding element between energy source and target component. The shielding may include an aforementioned material in this section, a mechanical design configured to dissipate the interfering energy, and/or a combination thereof. The shielding comprising material, location and additional shielding elements may defend a vulnerable component from one or more types of energy at a single time and instance or include separate shielding for individual potentially interfering energies.

Figure 6:
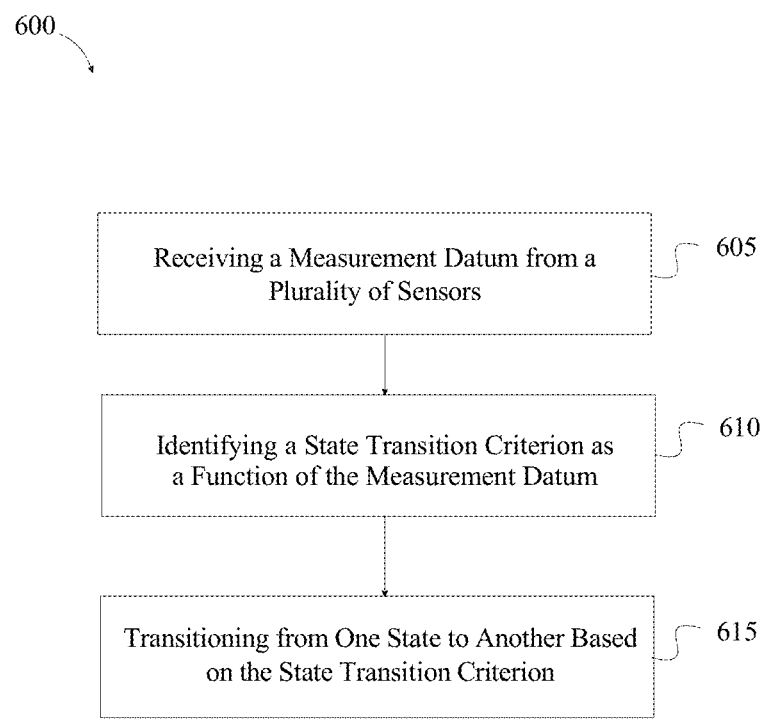
FIG. 6 is a flow chart of an exemplary embodiment of a method of battery pack management in one or more aspects of the present disclosure.

Referring now to FIG. 6, a flow chart showing an exemplary management method 600 of BMS 100 is shown in accordance with one or more embodiments of the present disclosure. As shown in step 605, method 600 includes receiving measurement data from plurality of sensors 124 that corresponds to an operation condition of battery pack 136 and/or components thereof. Receiving measurement data from plurality of sensors may include using sensors described in this disclosure, such as in FIGS. 1-5. As shown in step 610, method 600 includes identifying, by control circuit 128, a state of transition criterion as a function of the measurement data. Identifying state of transition criteria may include using any control circuit described in this disclosure, such as in FIGS. 1-5. As shown in step block 615, method 600 includes transitioning, by control circuit 128, from one operational state to another operational state as a function of the state transition criterion. As previously described in this disclosure, control circuit 128 may transition from a first state to a second state, where, in the first state, control circuit operates at a first duty cycle and communicates with a first subset of the plurality of sensors and the control circuit, when in the second state, operates at a second duty cycle and communicates with a second subset of the plurality of sensors, where the second duty cycle is distinct from the first duty cycle, and the second subset is distinct from the first subset.

Figure 7:
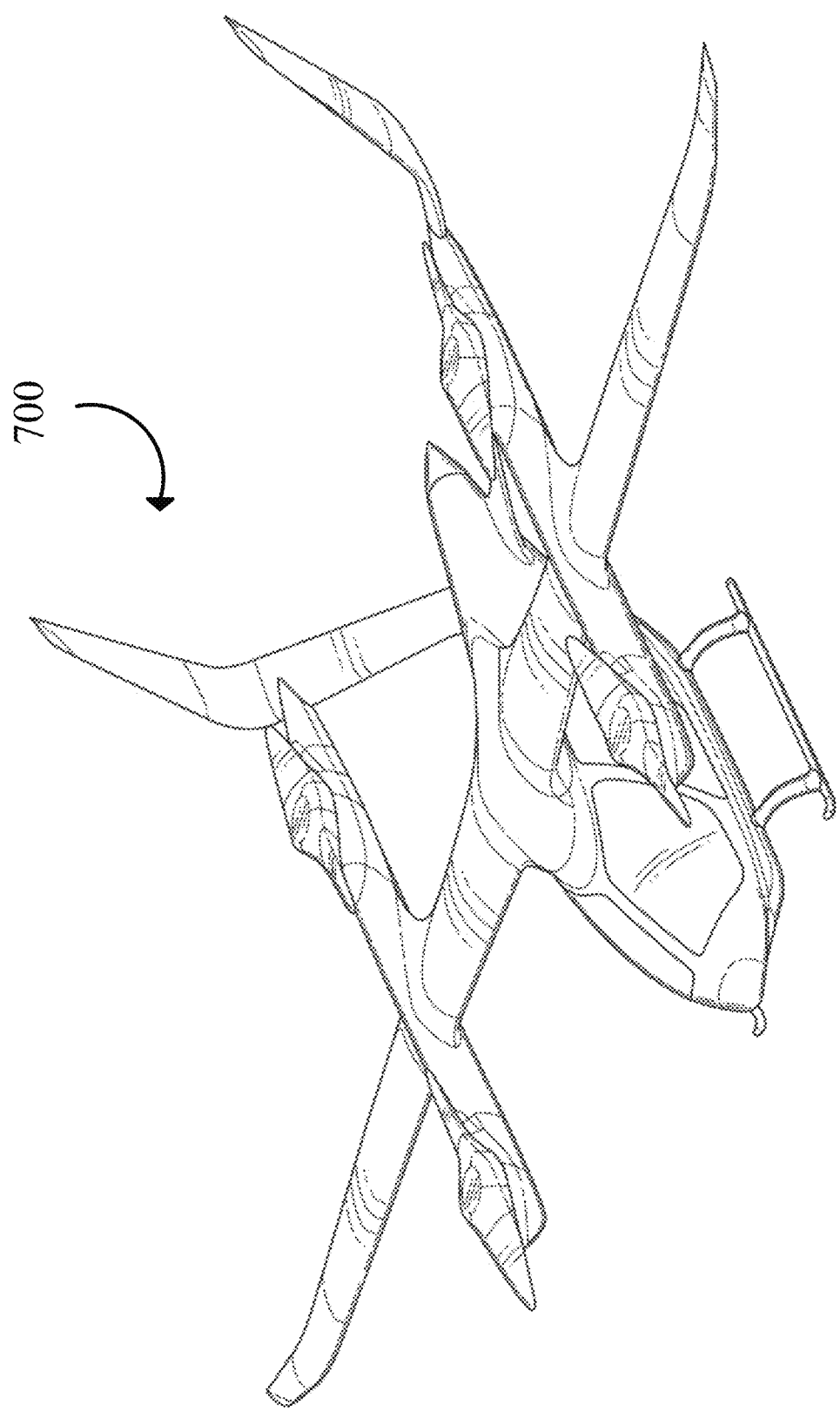
FIG. 7 is an illustration of an embodiment of an electric aircraft in one or more aspect of the present disclosure.

Referring now to FIG. 7, an embodiment of an electric aircraft 700 is presented in accordance with one or more embodiments of the present disclosure. Electric aircraft 700 may include a vertical takeoff and landing aircraft (eVTOL). As used herein, a vertical take-off and landing (eVTOL) aircraft is one that can hover, take off, and land vertically. An eVTOL, as used herein, is an electrically powered aircraft typically using an energy source, of a plurality of energy sources to power the aircraft. In order to optimize the power and energy necessary to propel the aircraft. eVTOL may be capable of rotor-based cruising flight, rotor-based takeoff, rotor-based landing, fixed-wing cruising flight, airplane-style takeoff, airplane-style landing, and/or any combination thereof. Rotor-based flight, as described herein, is where the aircraft generated lift and propulsion by way of one or more powered rotors coupled with an engine, such as a "quad copter," multi-rotor helicopter, or other vehicle that maintains its lift primarily using downward thrusting propulsors. Fixed-wing flight, as described herein, is where the aircraft is capable of flight using wings and/or foils that generate life caused by the aircraft's forward airspeed and the shape of the wings and/or foils, such as airplane-style flight.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 8:
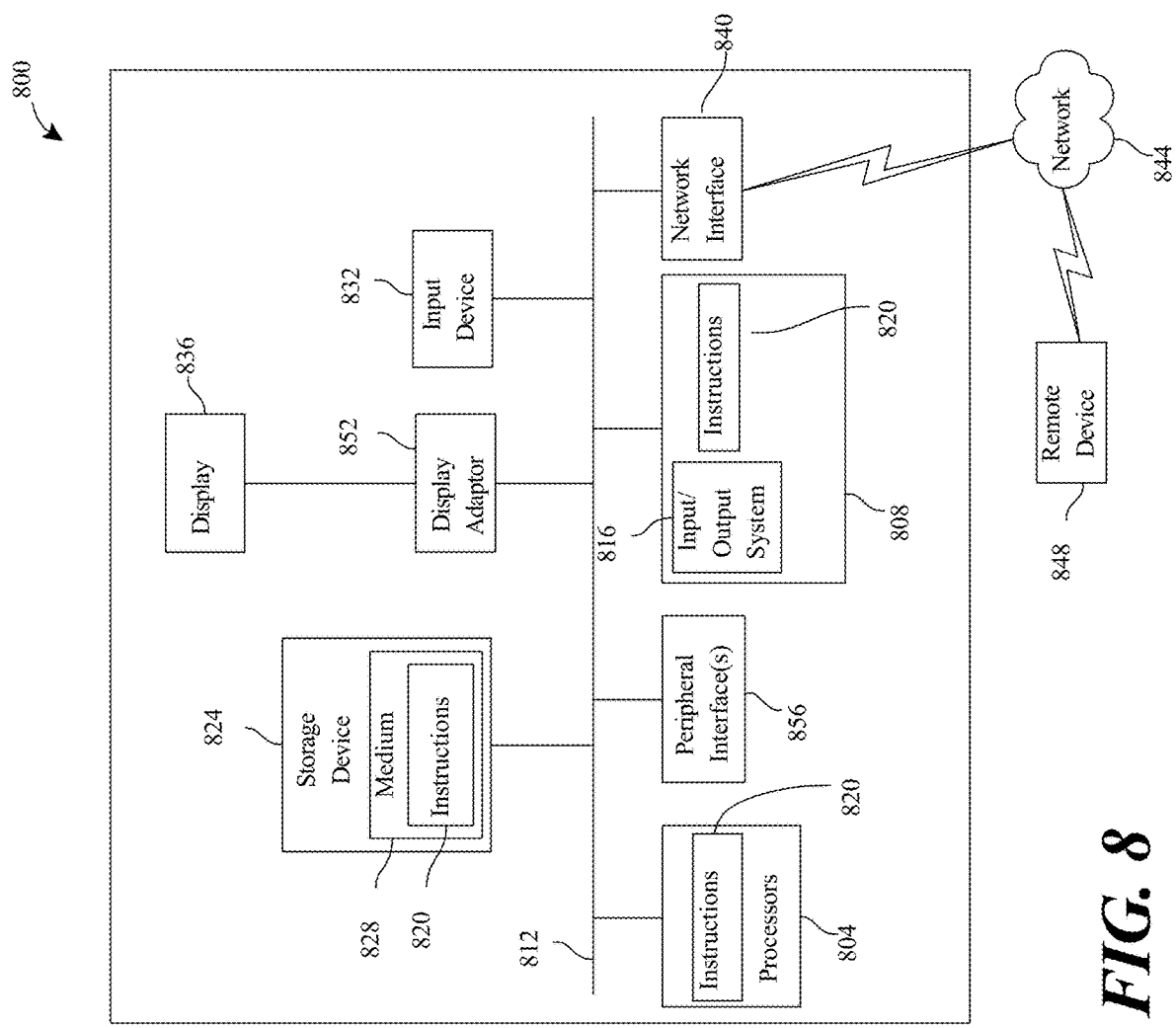
FIG. 8 is a block diagram of a computing system that can be used to implement any one or more of the methodologies disclosed herein and any one or more portions thereof.

FIG. 8 shows a diagrammatic representation of one embodiment of a computing device in the exemplary form of a computer system 800 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 800 includes a processor 804 and a memory 808 that communicate with each other, and with other components, via a bus 812. Bus 812 may include any of several types of bus structures including, but not limited to, a memory bus, a memory controller, a peripheral bus, a local bus, and any combinations thereof, using any of a variety of bus architectures.

Memory 808 may include various components (e.g., machine-readable media) including, but not limited to, a random-access memory component, a read only component, and any combinations thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of program modules including, but not limited to, an operating system, one or more application programs, other program modules, program data, and any combinations thereof.

Computer system 800 may also include a storage device 824. Examples of a storage device (e.g., storage device 824) include, but are not limited to, a hard disk drive, a magnetic disk drive, an optical disc drive in combination with an optical medium, a solid-state memory device, and any combinations thereof. Storage device 824 may be connected to bus 812 by an appropriate interface (not shown). Example interfaces include, but are not limited to, SCSI, advanced technology attachment (ATA), serial ATA, universal serial bus (USB), IEEE 894 (FIREWIRE), and any combinations thereof. In one example, storage device 824 (or one or more components thereof) may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data for computer system 800. In one example, software 820 may reside, completely or partially, within machine-readable medium 828. In another example, software 820 may reside, completely or partially, within processor 804.

Computer system 800 may also include an input device 832. In one example, a user of computer system 800 may enter commands and/or other information into computer system 800 via input device 832. Examples of an input device 832 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 832 may be interfaced to bus 812 via any of a variety of interfaces (not shown) including, but not limited to, a serial interface, a parallel interface, a game port, a USB interface, a FIREWIRE interface, a direct interface to bus 812, and any combinations thereof. Input device 832 may include a touch screen interface that may be a part of or separate from display 836, discussed further below. Input device 832 may be utilized as a user selection device for selecting one or more graphical representations in a graphical interface as described above.

A user may also input commands and/or other information to computer system 800 via storage device 824 (e.g., a removable disk drive, a flash drive, etc.) and/or network interface device 840. A network interface device, such as network interface device 840, may be utilized for connecting computer system 800 to one or more of a variety of networks, such as network 844, and one or more remote devices 848 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 844, may employ a wired and/or a wireless mode of communication. In general, any network topology may be used. Information (e.g., data, software 820, etc.) may be communicated to and/or from computer system 800 via network interface device 840.

Computer system 800 may further include a video display adapter 852 for communicating a displayable image to a display device, such as display device 836. Examples of a display device include, but are not limited to, a liquid crystal display (LCD), a cathode ray tube (CRT), a plasma display, a light emitting diode (LED) display, and any combinations thereof. Display adapter 852 and display device 836 may be utilized in combination with processor 804 to provide graphical representations of aspects of the present disclosure. In addition to a display device, computer system. 800 may include one or more other peripheral output devices including, but not limited to, an audio speaker, a printer, and any combinations thereof. Such peripheral output devices may be connected to bus 812 via a peripheral interface 856. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve embodiments according to this disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A battery management system for an electric aircraft, the system comprising:
   a plurality of sensors configured to detect a plurality of measurement data corresponding to at least an operating condition of a battery module; and
   a control circuit communicatively connected to the plurality of sensors and configured to monitor the operating condition of the battery module as a function of the plurality of measurement data, wherein:

the control circuit is configured to transition from a first state and a second state upon identifying a state transition criterion as a function of the measurement data;

the control circuit, when in the first state, operates at a first duty cycle and communicates with a first subset of the plurality of sensors; and the control circuit, when in the second state, operates at a second duty cycle and communicates with a second subset of the plurality of sensors, wherein:

the second duty cycle is distinct from the first duty cycle; and the second subset is distinct from the first subset.

2. The system of claim 1, wherein the control circuit is further configured to transition from a second state and a third state upon identifying a second state transition criterion;

the control circuit, when in the third state, operates at a third duty cycle and communicates with a third subset of the plurality of sensors, wherein:

the third duty cycle is distinct from the second duty cycle; and the third subset is distinct from the second subset.

3. The system of claim 2, wherein:

the third state comprises a dormant state; and the third duty cycle is lower than the second duty cycle; and the third subset comprises less sensors than the second subset.

4. The system of claim 1, wherein:

the first state comprises an active state; and the second state comprises a charging state.

5. The system of claim 1, wherein the first duty cycle comprises a 100 percent duty cycle.

6. The system of claim 1, wherein the first duty cycle comprises a 50 percent duty cycle.

7. The system of claim 1, wherein the plurality of sensors comprises one or more module monitor units (MMUs).

8. The system of claim 1, wherein the control circuit comprises a low-power chip.

9. The system of claim 8, wherein the low-power chip comprises a PIC microcontroller.

10. The system of claim 9, further comprising a watchdog timer configured to awaken the PIC microcontroller as a function of the state transition criterion.

11. The system of claim 1, wherein the control circuit comprises a memory component configured to store the measurement data from the plurality of sensors.

12. The system of claim 1, wherein the state transition criterion comprises an output voltage within a preconfigured range.

13. The system of claim 1, wherein the state transition criterion comprises an input current within a preconfigured range.

14. They system of claim 1, wherein the state transition criterion comprises a received signal from a remote device.

15. The system of claim 1, wherein:

identifying an operating condition comprises identifying a temperature of the battery pack;

determining a critical event comprises determining the voltage of the battery pack is outside the predetermined threshold, which comprises an upper temperature threshold; and alternating an operation mode includes alternating to a high-power operation mode as a function of the critical event.

16. A method of operation by a battery management system for an electric aircraft, the method comprising:

receiving, by a plurality of sensors, measurement data corresponding to at least an operating condition of a battery module;

identifying, by a control circuit communicatively connected to the plurality of sensors, a state transition criterion as a function of the measurement data; and transitioning, by the control circuit, from a first state and a second state;

wherein the control circuit, when in the first state, operates at a first duty cycle and communicates with a first subset of the plurality of sensors; and wherein the control circuit, when in the second state, operates at a second duty cycle and communicates with a second subset of the plurality of sensors, wherein:

the second duty cycle is distinct from the first duty cycle; and the second subset is distinct from the first subset.

17. The method of claim 16, further comprising transitioning, by the control circuit, from a second state and a third state upon identifying a second state transition criterion;

wherein the control circuit, when in the third state, operates at a third duty cycle and communicates with a third subset of the plurality of sensors, wherein:

the third duty cycle is distinct from the second duty cycle; and the third subset is distinct from the second subset.

18. The method of claim 17, wherein:

the third state comprises a dormant state; and the third duty cycle is lower than the second duty cycle; and the third subset comprises less sensors than the second subset.

19. The method of claim 16, wherein:

the first state comprises an active state; and the second state comprises a charging state.

20. The method of claim 16, wherein the state transition criterion comprises an output voltage within a preconfigured range.

* * * * *